United States Patent [19]

Usugi

[11] 4,380,826
[45] Apr. 19, 1983

[54] CONTROL SYSTEM FOR CHANNEL SELECTION

[75] Inventor: Kikuo Usugi, Toda, Japan

[73] Assignee: Clarion Co., Ltd., Tokyo, Japan

[21] Appl. No.: 214,509

[22] Filed: Dec. 9, 1980

[51] Int. Cl.³ .................. H04B 1/26; H03L 7/18
[52] U.S. Cl. .................. 455/165; 455/160; 455/183; 455/185
[58] Field of Search .......... 455/165, 166, 168, 183, 455/185, 186, 160

[56] References Cited

U.S. PATENT DOCUMENTS

| 4,253,194 | 2/1981 | Van Deursen | 455/185 |
| 4,285,066 | 8/1981 | Van Deursen | 455/185 |
| 4,287,599 | 9/1981 | Goncharoff et al. | 455/166 |

FOREIGN PATENT DOCUMENTS

| 55-77242 | 6/1980 | Japan | 455/186 |
| 55-77243 | 6/1980 | Japan | 455/186 |

Primary Examiner—Marc E. Bookbinder
Attorney, Agent, or Firm—Harris, Kern, Wallen & Tinsley

[57] ABSTRACT

A channel-selection control system for a frequency synthesizer type receiver which comprises: a frequency synthesizer (1); a plurality of switches (SW$_1$, SW$_2$) corresponding to channels having different broadcasting programs, respectively; a plurality of memories (ROM$_1$, ROM$_2$) associated with the respective switches (SW$_1$, SW$_2$) and each storing data signals (n) corresponding to broadcasting waves for one broadcasting program; a clock generator (CK) for producing clock pulses; a counter (CNT) adapted to count up by the clock pulses for producing address signals (m) for the memories; a comparator (COMP) for comparing a level value of a received signal outputted from said frequency synthesizer (1) with a preset reference level value; and a gate circuit (G$_4$) responsive to said comparator for preventing the clock pulses from being inputted to said counter (CNT) when the level value of the received signal is higher than the reference level value and for allowing the clock pulses to be inputted to the counter (CNT) when the level value of the received signal is lower than the reference level value; the data signal corresponding to the address signal produced from said counter (CNT), being read out from the memory (ROM$_1$, ROM$_2$) associated with the switch (SW$_1$, SW$_2$) selected; said read out data signal being supplied as a program signal to a programmable divider (PD) included in a PLL circuit of the frequency synthesizer (1).

5 Claims, 2 Drawing Figures

CONTROL SYSTEM FOR CHANNEL SELECTION

BACKGROUND OF THE INVENTION

Field of the Invention

This invention relates to a channel-selection control system for a PLL (phase-locked loop) type synthesizer receiver, and more particularly to a channel-selection control system for a frequency synthesizer type receiver, which is operative in association with a programmable divider with a variable division ratio, constituting a part of a PLL circuit of the frequency synthesizer type receiver, and capable of detecting and receiving, among plural broadcasting waves, one which is in good reception condition and whose level exceeds a preset reference level, in a broadcasting system wherein one broadcasting program is transmitted in the form of broadcasting waves of different frequencies.

In some broadcasting system, a plurality of channels have different broadcasting contents or programs, respectively, and each of the broadcasting content or program is transmitted at different frequencies. For example, according to Nihon Shortwave Broadcasting, the first channel (the first program) uses frequencies of 3,925, 6,055 and 9,595 MHz and the second channel (the second program) uses frequencies of 3,945, 6,155 and 9,760 MHz for broadcasting the first and the second program, respectively. In such a broadcasting system, it is very effective to automatically detect and receive, among broadcasting waves, one which is in good reception condition and whose level exceeds a preset reference level.

SUMMARY OF THE INVENTION

It is therefore an object of the present invention to provide a novel channel-selection control system for a frequency synthesizer type receiver, with a view to meeting the demands in the field.

In accordance with the present invention, there is provided a control system for channel selection which comprises:

a frequency synthesizer;

a memory means provided for respective channel for storing data signals respectively corresponding to broadcasting waves having the same broadcasting content;

a clock generating means for producing clock pulses;

a first counter means counting the clock pulses for producing an address signal of the memory means and supplying said signal to the memory means;

a channel-selecting means for selecting a data signal outputted from said memory means in response to the address signal and for applying said data signal to said frequency synthesizer;

a reference level setting means;

a means for comparing a level of a received signal outputted from said frequence synthesizer and reference level set by said referency level setting means; and a first gate circuit for selectively supplying clock pulses to said first counter means from said clock generating means in response to an output from the comparing means.

DESCRIPTION OF THE EMBODIMENTS

Figure 1:
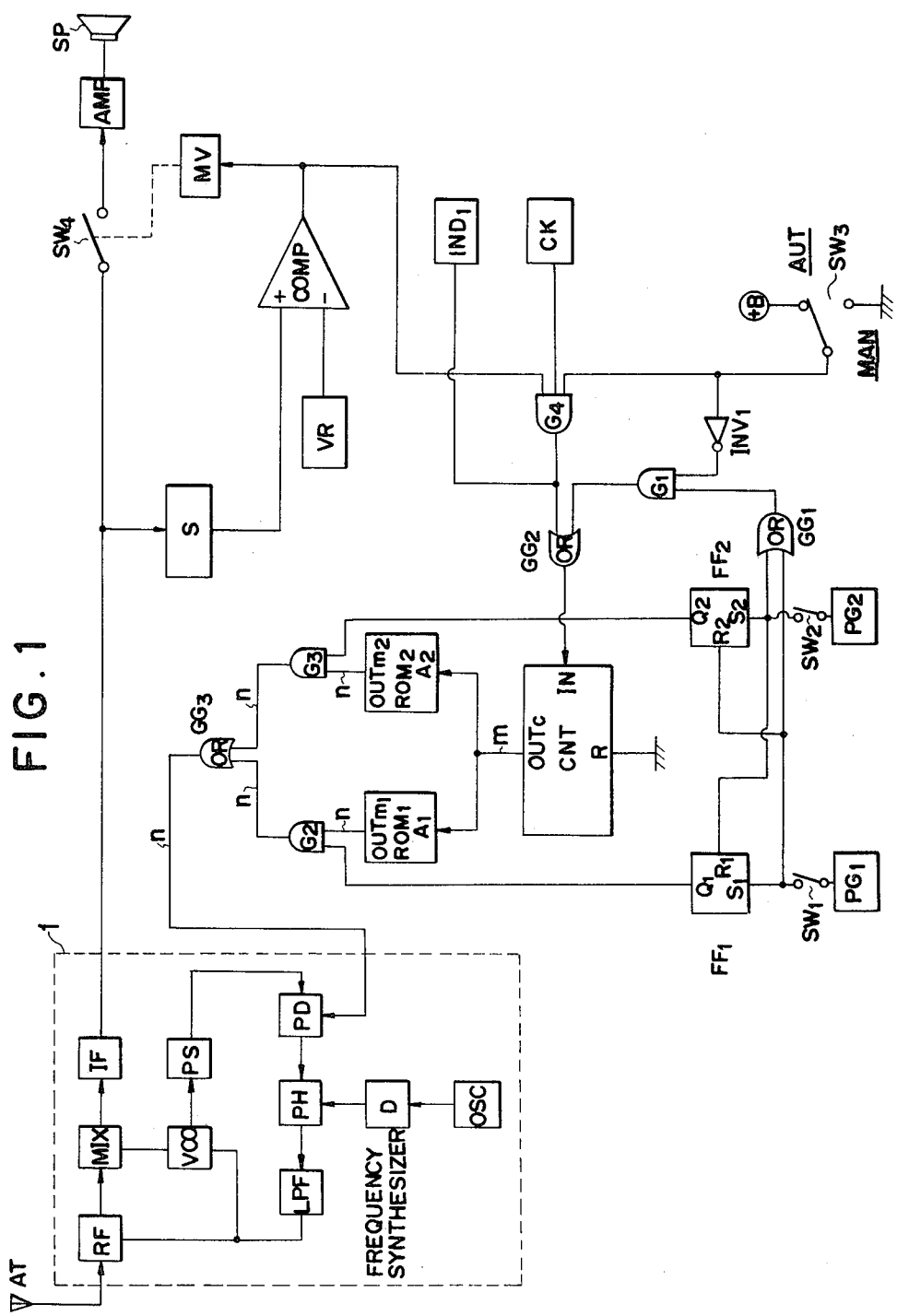
FIG. 1 is a block diagram of one embodiment of the present invention.

FIG. 1 illustrates one embodiment of a channel-selection control system for a frequency synthesizer type receiver in accordance with the present invention, which is applicable to a broadcasting system such that two channels $CH_1$ and $CH_2$ have different broadcasting contents or programs and the broadcasting content of each of the channels is transmitted through two or more broadcasting waves.

A frequency synthesizer portion 1 is formed essentially of a known prescaler type PLL circuit. More specifically, the PLL circuit is comprised of a local oscillator VCO, a prescaler (1/p frequency divider) PS, a programmable divider PD, a phase detector PH and a low pass filter LPF. An oscillation frequency of an output from the local oscillator VCO is controlled, by a data signal (a program signal shown as an n-bit signal) supplied to the programmable divider PD as will be described in detail later, so that desired frequency can be received. In the figure, AT is an autenna, RF is a radio-frequency circuit, MIX is a mixer circuit, IF is an intermediate-frequency amplifier circuit, OSC is a reference oscillator, and D is a divider. An output from the frequency synthesizer portion 1, i.e., an output from the intermediate-frequency amplifier circuit IF, a received signal, is applied to a loudspeaker SP through a low-frequency amplifier AMP.

$SW_1$ and $SW_2$ designate channel-selecting switches coupled to suitable pulse generating circuits $PG_1$ and $PG_2$, respectively. When the switch $SW_1$ is closed, the receiver is rendered ready to receive a broadcasting wave of the first channel $CH_1$, and when the switch $SW_2$ is closed, the receiver is rendered ready to receive a broadcasting wave of the second channel $CH_2$. A first read-only memory $ROM_1$ stores program data corresponding to the plural frequencies (for example, 3,925, 6,055, 9,595 MHz in Nihon Shortwave Broadcasting, through which the broadcasting content of the first channel $CH_1$ is transmitted, while a second read-only memory $ROM_2$ stores program data corresponding to the plural frequencies (for exampel, 3,945, 6,115, 9,760 MHz in Nihon Shortwave Broadcasting) through which the content of the broadcasting content is transmitted. The data stored in the first and second memories $ROM_1$ and $ROM_2$, respectively, are addressed by address signals (illustrated as m-bit signals, respectively) provided by an output $OUT_c$ from a counter CNT. Data read out from a memory output$_{m1}$ and a memory output$_{m2}$ are selectively provided to the programmable divider PD for operating the frequency synthesizer portion 1.

When an operation selector switch $SW_3$ is at a position MAN (grounded) so as to manually search broadcasting waves to find a wave in a good reception condition, the control system of the invention will operate as follows:

In case the switch $SW_2$ has first been in the closed state to receive a broadcasting wave of the channel $CH_2$ and, then, the switch $SW_1$ is closed to receive a broadcasting wave of the first channel $CH_1$, a flip-flop circuit $FF_1$ is set by a pulse from the pulse generating circuit $PG_1$ and, at the same time, a flip-flop circuit $FF_2$ is reset. Since one input of an AND gate $G_1$ becomes high by an output from an inverter $INV_1$, the pulse signal generated by the pulse generating circuit $PG_1$ upon closing of the switch $SW_1$ is supplied to an input IN of the first counter CNT through an OR gate $GG_1$, the AND gate $G_1$ and an OR gate $GG_2$. As a result, an address signal is produced from an output $OUT_c$ from the counter CNT, and a data signal corresponding to the address signal is read out from the memory $ROM_1$. Since a $Q_1$ output from the flip-flop circuit $FF_1$ is supplied to one input of an AND gate $G_2$, the read-out data signal is supplied to the programmable divider PD of the frequency synthesizer portion 1 through the AND gate $G_2$ and an OR gate $GG_3$, which enables receiving of a broadcasting wave of the channel $CH_1$ which corresponds to the data signal read out by the address signal from the counter CNT.

When the reception condition of such a broadcasting wave becomes unsatisfactory, and the switch $SW_1$ is operated to be closed again, a pulse signal generated thereby is supplied to the input IN of the counter CNT through the OR gate $GG_1$, the AND gate $G_1$ and the OR gate $GG_2$ to count up the counter CNT. Therefore, a different data signal is read out from the memory $ROM_1$ by a new address signal produced from an output $OUT_c$ from the counter CNT, and another broadcasting wave (having the same broadcasting content) corresponding to this data signal becomes receivable.

Thus, upon every closing of the switch $SW_1$, different broadcasting waves of the channel $CH_1$ can be received sequentially to search for a broadcasting wave which can be received in a good condition.

An operation when the switch $SW_2$ is closed to receive a broadcasting wave of the second channel $CH_2$ is similar to that when the switch $SW_1$ is closed. More specifically, when the switch $SW_1$ is opened and the switch $SW_2$ is closed, the flip-flop circuit $FF_1$ is reset by a pulse generated by the pulse generating circuit $PG_2$ and, at the same time, the flip-flop circuit $FF_2$ is set, so that a $Q_2$ output from the flip-flop circuit $FF_2$ is supplied to one input of an AND gate $G_3$. This enables receiving of a broadcasting wave of the channel $CH_2$ which corresponds to a data signal read out from the memory $ROM_2$ by an address signal from the first counter CNT. Thereafter, upon every closing of the switch $SW_2$, different broadcasting waves of the channel $CH_2$ are received sequentially to search a broadcasting wave which can be received in a good condition.

On the other hand, when the operation selector switch $SW_3$ is thrown to a position AUT which is connected to a positive power source, so as to automatically search a broadcasting wave which can be received in a good condition exceeding a predetermined receiving level, the control system of the invention will operate as follows:

An output of the intermediate-frequency amplifier IF is coupled to an input of a shaping circuit S. The shaping circuit S outputs a receiving level signal indicating a level of a field strength upon every receiving of a broadcasting wave, while a reference signal generating circuit VR outputs a reference level signal indicating a value of a predetermined reference level. The receiving level signal and the reference level signal are inputted to a comparator COMP to be subjected to comparison by the comparator COMP. An output of the comparator COMP becomes high when the field strength of the received signal is reduced and the level value of the receiving level signal is lower than that of the reference level signal, and becomes low, indicating a good receiving condition, when the level value of the receiving level signal is higher than that of the reference level signal.

Assuming that the field strength of the received signal is low and the output of the comparator COMP is high, and the operation selector switch $SW_3$ is switched to the position AUT connected to the $+B$ power source, an AND gate $G_4$ is put into an operative state so that a clock pulse output from a clock generator CK is supplied to the input IN of the counter CNT through the AND gate $G_4$ and the OR gate $GG_2$. At this time, since an output of the inverter $INV_1$ is at a low level, the AND gate $G_1$ is in an inoperative state. The counter CNT counts up by every clock pulse inputted thereto to successively output address signals. As a result, data stored in the memory $ROM_1$ or $ROM_2$ is read out, according to the positions of the switches $SW_1$ and $SW_2$, so that broadcasting waves of the channel $CH_1$ or $CH_2$ are received sequentially. Although the counter CNT counts up by clock pulses inputted thereto, to successively produce address signals for reading out data stored in the memory $ROM_1$ or $ROM_2$, it is reset to recover the original state when all the data stored in the memory $ROM_1$ or $ROM_2$ is scanned.

In the automatic searching operation mode, when the level value of the received level signal outputted from the shaping circuit S becomes higher than the reference level value and a good receiving condition is detected, the input of the AND gate $G_4$ coupled to the coutput of the comparator COMP becomes low so that the clock pulse outputted from the clock generator CK is prevented from being inputted to the counter CNT. Thus, the good reception condition can be maintained.

When the output of the comparator COMP is high, i,e., the level value of the received level signal does not exceed the preset reference level value, a switch $SW_4$ is opened by an output of a monostable multivibrator MV to prevent inputting to the low-frequency amplifier AMP, and an indicator $IND_1$ is, for example, lit to indicate a searching mode.

In this embodiment, when the level values of the received level signals of all the received broadcasting waves are lower than the preset reference level value, the searching operation is carried out endlessly. In such a case, the operation selector switch $SW_3$ is thrown to the position MAN so as to search a broadcasting wave which can be received in a less worse condition, in such a manner as described above. Alternatively, the reference level set by the reference signal generating circuit VR may be made variable so as to change a reference level according to reception areas. In this case, a broadcasting wave in a good reception condition can be continuously searched by an automatic operation without requiring a manual operation.

Figure 2:
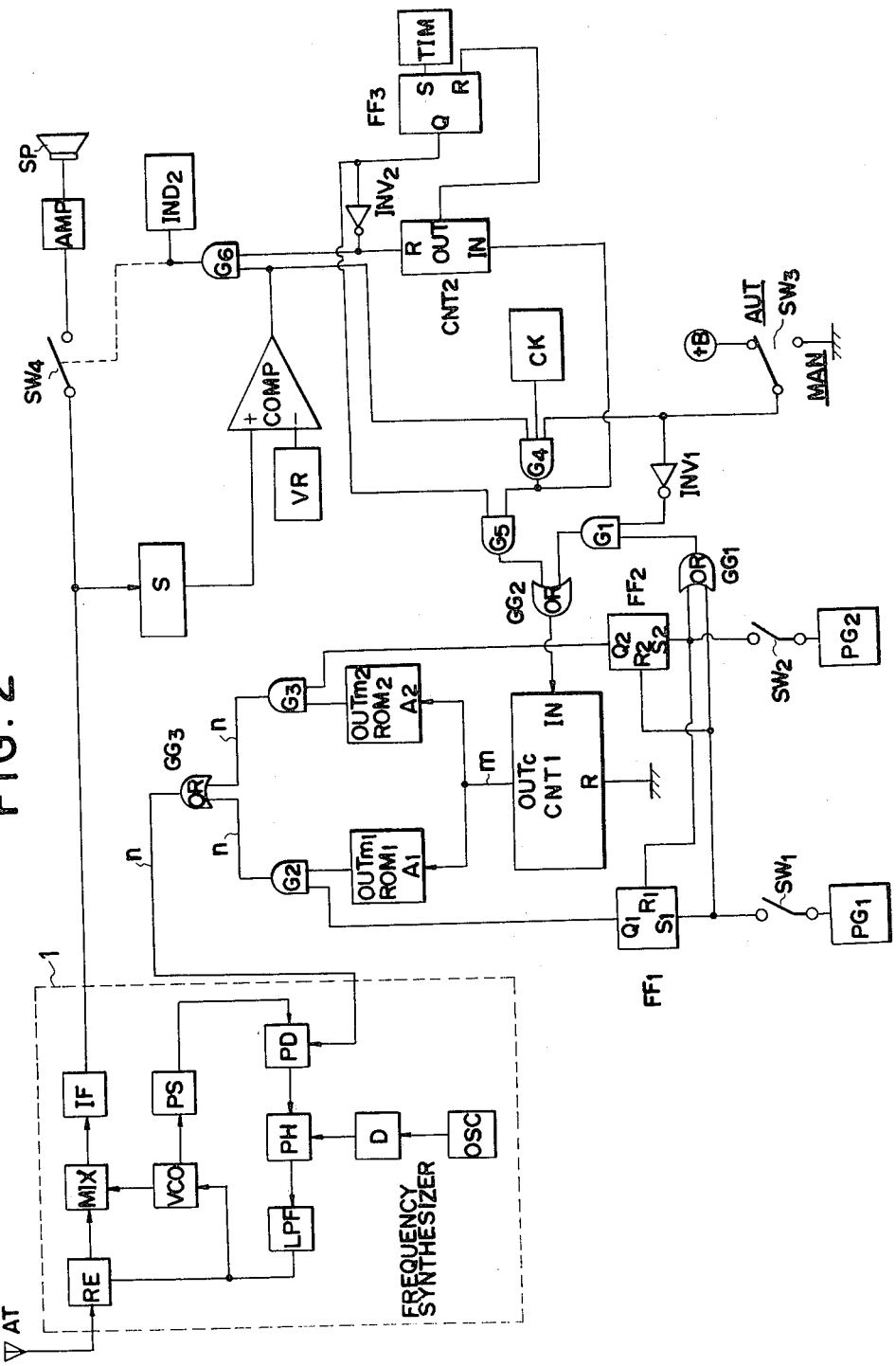
FIG. 2 is a similar block diagram of another embodiment of the present invention.

FIG. 2 shows another embodiment of the present invention, which further includes a timer TIM, a flip-flop circuit $FF_3$ and a second counter $CNT_2$ and can perform an improved automatic searching operation. The manual searching operation by the switches $SW_1$ to $SW_3$ is substantially the same as that of the foregoing embodiment.

Under such conditions that the flip-flop circuit $FF_3$ is set by a pulse signal supplied at given periods from the timer TIM, an output Q of the flip-flop circuit $FF_2$ is high, the field strength of the received signal is low and an output of the comparator COMP is high, when the operation selector switch $SW_3$ is actuated to the position AUT, the clock pulse output from the clock generator CK is provided to the input IN of the first counter $CNT_1$ through the AND gate $G_4$, an AND gate $G_5$ and the OR gate $GG_2$ and, at the same time, to an input IN of the second counter $CNT_2$. The counters $CNT_1$ and $CNT_2$ count up upon every inputting of clock pulses, and the counter $CNT_1$ outputs address signals sequentially. As a result, the data stored in the memory $ROM_1$ or $ROM_2$ is read out depending on the positions of the switches $SW_1$ and $SW_2$, enabling broadcasting waves of the channel $CH_1$ or $CH_2$ to be received sequentially. In this connection, it is to be noted that while the counter $CNT_1$ counts up by the clock pulses inputted thereto, to sequentially produce address signals, for reading out the data stored in the memory $ROM_1$ or $ROM_2$, the output OUT of the second counter $CNT_2$ is rendered high to reset the flip-flop circuit $FF_3$ when the counter $CNT_2$ reaches a preset count number, e.g., when all the data stored in the memory $ROM_1$ or $ROM_2$ are scanned. As a result, one output of the AND gate $G_5$ becomes low by a signal from the output Q of the flip-flop circuit $FF_3$, and no clock pulses are supplied to the counter $CNT_1$ any more. Thus, the system of the invention can be prevented from repeating the searching operation when the reception level signals of the all received broadcasting waves are lower than the preset reference level value. In addition, since an indicator $IND_2$ (a lamp indicator, or a sound indicator such as a buzzer, a synthetic sound generator, etc.) is coupled to an output of an AND gate $G_6$, a condition that reception is not possible can be indicated. Furthermore, by opening the switch $SW_4$ to prevent inputting to the low-frequency amplifier AMP, the speaker SP can be disconnected.

In the automatic searching operation mode, when the level value of the reception level signal outputted from the shaping circuit S becomes higher than the reference level value and a good reception condition is detected, the input of the AND gate $G_4$ coupled to the output of the comparator COMP becomes low so that a clock pulse outputted from the clock generator CK is prevented from being inputted to the counter CNT and the desired reception condition can be maintained.

According to the present invention as described above, it is possible to easily and quickly search a broadcasting wave in a good reception condition which exceeds the preset reference level value in the broadcasting system wherein one broadcasting program is transmitted through plural broadcasting waves. Therefore, the channel-selection control system of the invention is the most suitable for a moving receiver such as a car radio.

When the invention is applied to the reception of, for example, Japan Shortwave Broadcasting, the address signals outputted from the counter $CNT_1$ may be processed by a suitable decoder so as to selectively light an indicating lamp corresponding to the wave 3, 6 or 9 MHz.

Although the control system of the present invention is adapted for two-channel broadcasting system in the embodiments as illustrated, it may also be applicable to a multi-channel broadcasting system by further employing memories, flip-flop circuits, switches, etc.

I claim:

1. A control system for channel selection in a frequency synthesized radio receiver which comprises:
   a frequency synthesizer coupled to a receiver front end portion;
   a memory means provided for storing data signals respectively corresponding to broadcasting waves having the same broadcasting content;
   a clock generating means for producing clock pulses;
   a first counter means counting the clock pulses for producing an address signal of the memory means and supplying said signal to the memory means;
   a channel-selecting means for selecting a data signal outputted from said memory means in response to the address signal and for applying said data signal to said frequency synthesizer to control it so that said front end portion receives a broadcasting wave signal having a desired frequency corresponding to said data signal;
   a reference level setting means;
   a means for comparing a level of the received broadcasting wave signal outputted from said front end portion and a reference level set by said reference level setting means; and
   a first gate means coupled to said means for comparing for selectively supplying clock pulses to said first counter means from said clock generating means, said channel-selecting means being comprised of selecting switches corresponding to respective channels, pulse generating circuits connected to said switches, respectively, flip-flop circuits each adapted to be set by a pulse supplied from the respective pulse generating circuit through the respective selecting switch, and a second gate means for selecting the data signal from said memory means in response to an output from one of said flip-flop circuits.

2. A control system for channel selection according to claim 1, which further comprises a first switch means for on-off controlling the received broadcasting wave signal outputted from said front end portion in response to an output from the comparing means, a second counter means, and a means for controlling said first switch means in response to a count-output from said second counter means.

3. A control system for channel selection according to claim 1, which further comprises a third gate means for selectively supplying pulses from the pulse generating circuits to said first counter through the respective switches, and an operating means for automatic-manual channel selection to selectively render said third gate means operative.

4. A control system for channel selection according to claim 2, wherein the control means is comprised of a timer, a flip-flop circuit set by an output from the timer and reset by a count-output from the second counter, and a fourth gate means for selectively providing an output pulse from said first gate means to said first counter means in response to an output from said flip-flop circuits.

5. A control system for channel selection according to claim 2, wherein said control means includes an indicating means for indicating that the count by said second counter means reaches a predetermined value.

* * * * *